United States Patent
Gabai

(10) Patent No.: US 8,111,532 B1
(45) Date of Patent: *Feb. 7, 2012

(54) METHOD AND APPARATUS FOR CAM WITH REDUNDANCY

(75) Inventor: Amir Gabai, Modii'n (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/014,970

(22) Filed: Jan. 27, 2011

Related U.S. Application Data

(63) Continuation of application No. 12/259,022, filed on Oct. 27, 2008, now Pat. No. 7,885,090.

(60) Provisional application No. 60/983,390, filed on Oct. 29, 2007.

(51) Int. Cl.
    *G11C 15/00*  (2006.01)
(52) U.S. Cl. .............. 365/49.1; 365/200; 365/49.15; 365/49.18
(58) Field of Classification Search ............ 365/49.1, 365/200, 49.15, 49.18, 189.07; 711/108
See application file for complete search history.

(56) References Cited

U.S. PATENT DOCUMENTS

| | | | |
|---|---|---|---|
| 6,445,628 B1 | 9/2002 | Pereira et al. | |
| 6,781,857 B1 | 8/2004 | Lien et al. | |
| 7,280,379 B2 | 10/2007 | Lee | |
| 7,286,380 B2 | 10/2007 | Hsu et al. | |
| 7,319,602 B1 * | 1/2008 | Srinivasan et al. | 365/49.1 |
| 7,505,295 B1 * | 3/2009 | Nataraj et al. | 365/49.1 |
| 7,885,090 B1 * | 2/2011 | Gabai | 365/49.1 |

* cited by examiner

*Primary Examiner* — David Lam

(57) ABSTRACT

Aspects of the disclosure provide a CAM module that can be used independent of a defective entry line. The CAM module can include at least a CAM array having at least X CAM entry lines, and an additional CAM entry line. Each CAM entry line may include a selection line for enabling the CAM entry line for writing and/or reading and an entry output for indicating matching to a search key. Further, the CAM module can include a decoder unit that can decode an address to enable one out of X word-lines, and an encoder unit that can encode X matching outputs to a matching address according to a predetermined priority sequence. Additionally, the CAM module can include a switching unit coupling the CAM array with the decoder unit and the encoder unit. The switching unit can select X CAM entry lines from the X+1 CAM entry lines based on a defective status of the CAM array; correspond the X word-lines of the decoder unit to the selection lines of the selected X CAM entry lines; and correspond the entry outputs of the selected X CAM entry lines to the X matching outputs of the encoder unit.

24 Claims, 5 Drawing Sheets

METHOD AND APPARATUS FOR CAM WITH REDUNDANCY

CROSS-REFERENCE TO RELATED APPLICATIONS

This application is a continuation of U.S. application Ser. No. 12/259,022, filed Oct. 27, 2008, which claims the benefit of U.S. Provisional Application No. 60/983,390, filed Oct. 29, 2007. The disclosures of the applications referenced above are incorporated herein by reference.

BACKGROUND

A content addressable memory (CAM), such as a ternary CAM (TCAM), can provide fast searching capabilities. For example, in a network communication application, a network device may use a TCAM module to store a plurality of switching rules. The plurality of switching rules can be used to determine an action on an incoming packet based on attributes of the incoming packet. Each switching rule can be stored in one or more TCAM entry lines in the TCAM module. A TCAM entry line may refer to a line of memory cells corresponding to a "word" address. During operation, all the TCAM entry lines can be compared with attributes of an incoming packet simultaneously to find a matching entry line belonging to a switching rule. The matching entry line can be used to inform the network device to handle the incoming packet according to the switching rule.

Generally, CAM entry lines of a CAM module can be configured according to a priority sequence. During a searching operation, it is possible that attributes of an incoming packet can match more than one CAM entry lines. The priority sequence can be used to select a CAM entry line that can be ahead of the rest of the more than one CAM entry lines according to the priority sequence. However, the priority sequence may be disturbed when entry lines are placed out of order in the CAM, as may occur if a redundant entry line is used to substitute a defective entry line conventionally.

SUMMARY

Aspects of the disclosure can provide a content addressable memory (CAM) device with a priority sequence that is independent of a defective status of the CAM device. Thus, the CAM device can use a redundant entry line to settle a defective entry line without affecting the priority sequence. Therefore, a user can use the CAM device in the same way no matter whether the CAM device includes a defective entry line or which entry line is defective.

Aspects of the disclosure can provide a CAM module. The CAM module can include at least a CAM array having at least X+1 CAM entry lines. Each CAM entry line may include a selection line for enabling the CAM entry line for writing and/or reading and an entry output for indicating matching to a search key. Further, the CAM module can include a decoder unit that can decode an address to enable one out of X word-lines, and an encoder unit that can encode X matching outputs to a matching address according to a predetermined priority sequence. Additionally, the CAM module can include a switching unit coupling the CAM array with the decoder unit and the encoder unit. The switching unit can select X CAM entry lines from the at least X+1 CAM entry lines based on a defective status of the CAM array; correspond the X word-lines of the decoder unit to the selection lines of the selected X CAM entry lines; and correspond the entry outputs of the selected X CAM entry lines to the X matching outputs of the encoder unit.

According to an aspect of the disclosure, the CAM array can be a ternary CAM (TCAM) array.

According to another aspect of the disclosure, the switching unit can store the defective status. In an embodiment, the switching unit can store a decoded address from the decoder unit corresponding to a defective entry line.

In an embodiment, the switching unit can include at least X+1 switches coupling the at least X+1 CAM entry lines to the X word-lines and the X matching outputs. A switch of the X+1 switches can be configured to multiplex at least one previous word-line and a current word-line to a current selection line based on the defective status of the CAM array, and multiplex a current entry output and at least one next entry output to a current matching output based on the defective status of the CAM array.

Further, the switch of the X+1 switches can include a first MUX that can multiplex the previous word-line and the current word-line to the current selection line, and a second MUX that can multiplex the current entry output and the next entry output to the current matching output. The first MUX and the second MUX can be controlled according to the defective status of the CAM array. In an embodiment, the switch may include a memory unit that can store a control value according to the defective status of the CAM array. The memory unit can be a non-volatile memory unit or a volatile memory unit. The memory unit may include a flip-flop that can store a word-line driving value corresponding to a defective entry address.

Aspects of the disclosure can provide a method for using a CAM module with entry line redundancy. The CAM module can include at least X+1 CAM entry lines. Each CAM entry line can include a selection line for enabling the CAM entry line for writing and/or reading and an entry output for indicating matching to a search entry line. Further, the CAM module can include a decoder unit that can decode an address to enable one out of X word-lines and an encoder unit that can encode X matching outputs to a matching address according to a predetermined priority sequence. Additionally, the CAM module can include a switching unit coupling the CAM array with the decoder unit and the encoder unit. The method can include identifying a defective status of the CAM array, and configuring the switching unit to select X CAM entry lines based on the identified defective status of the CAM array. Thus, the switching unit can correspond the X word-lines of the decoder unit to the selection lines of the selected X CAM entry lines, and can correspond the entry outputs of the selected X CAM entry lines to the X matching outputs of the encoder unit.

Aspects of the disclosure can also provide an integrated circuit (IC) chip. The IC chip may include a CAM module. The CAM module can include at least a CAM array having at least X+1 CAM entry lines. Each CAM entry line may include a selection line for enabling the CAM entry line for writing and/or reading and an entry output for indicating matching to a search key. Further, the CAM module can include a decoder unit that can decode an address to enable one out of X word-lines, and an encoder unit that can encode X matching outputs to a matching address according to a predetermined priority sequence. Additionally, the CAM module can include a switching unit coupling the CAM array with the decoder unit and the encoder unit. The switching unit can select X CAM entry lines from the at least X+1 CAM entry lines based on a defective status of the CAM array; correspond the X word-lines of the decoder unit to the selection lines of the selected X CAM entry lines; and correspond the entry outputs of the selected X CAM entry lines to the X matching outputs of the encoder unit.

Aspects of the disclosure can provide a content addressable memory (CAM) module. The CAM module can include at least a CAM array having at least X ordered CAM entry lines, and an additional CAM entry line. Each CAM entry line can include a selection line for enabling the CAM entry line for writing and/or reading and an entry output for indicating matching to a search key. Further, the CAM module can include a defect indicator for indicating a defect in at least one of the ordered CAM entry lines, and an order maintaining switching unit configured to bypass CAM entry lines that are indicated as being defective, and engage the additional CAM entry line, while maintaining the order for writing and/or reading and outputting entry lines that match a search key.

Additionally, the disclosed CAM may be integrated in various integrated circuit (IC) chips, and may be included in various devices, such as network switch, router, bridge, and the like.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
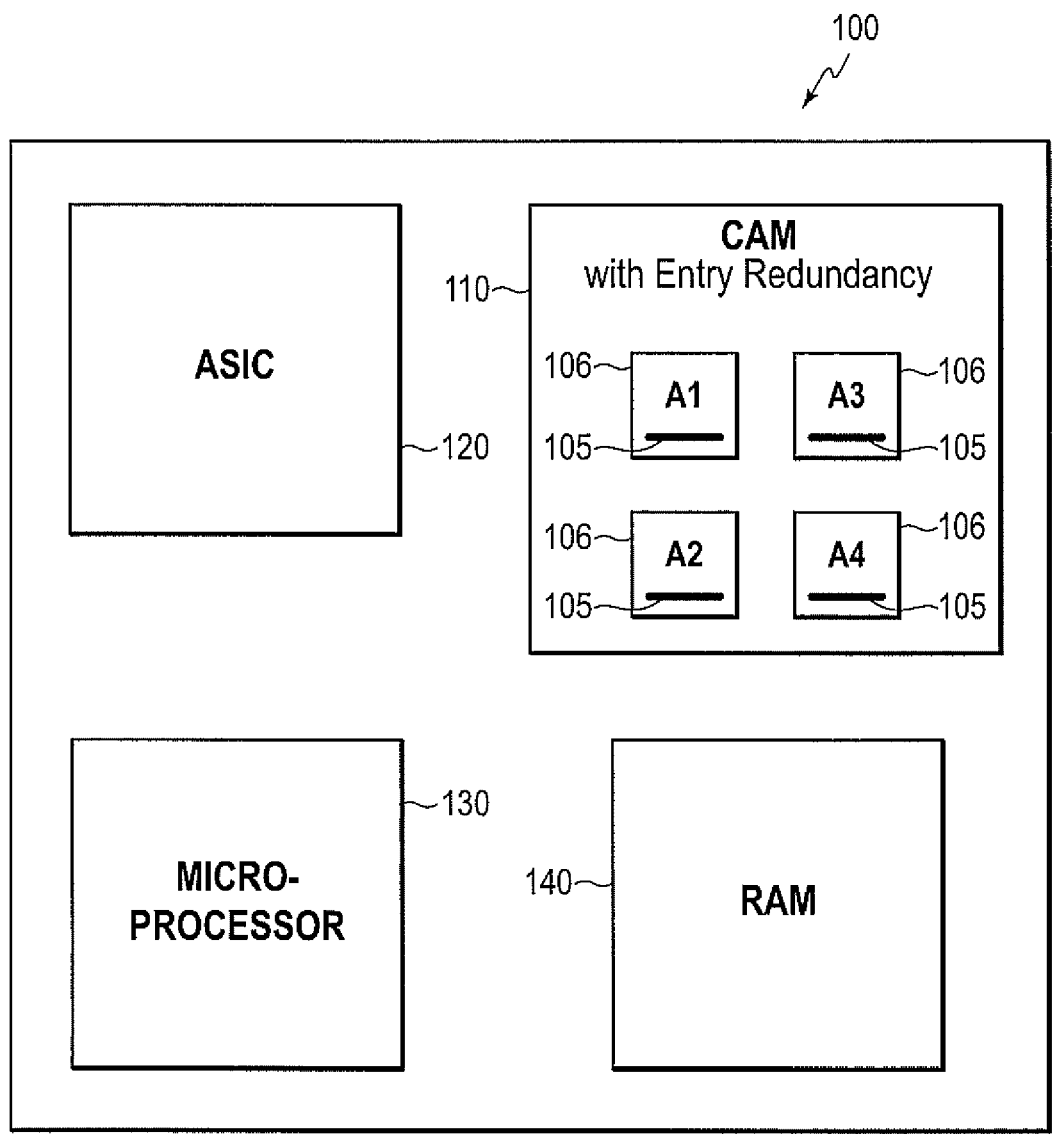
FIG. 1 shows an integrated circuit (IC) chip example having a content addressable memory (CAM) module with entry line redundancy.

FIG. 1 shows an integrated circuit (IC) chip example according to an embodiment of the disclosure. The IC chip 100 can include a content addressable memory (CAM) module 110, such as a ternary CAM (TCAM), with entry line redundancy. Additionally, the IC chip 100 may include other suitable circuit components that can be integrated with the CAM module 110 on an IC chip. In the example shown in FIG. 1, the IC chip 100 may include a processor module 130, an application specific integrated circuit (ASIC) module 120, and a random access memory (RAM) module 140. The IC chip 100 may be employed in a network switch, a router and a bridge, for example.

It is noted that an IC chip may solely include a CAM module. The CAM module may be coupled with various other suitable circuit components, such as processor module, memory module, and the like, that are located in other IC chips.

In an embodiment, the CAM module 110 can include a number of CAM arrays 106, such as A1-A4, and associated peripheral circuits, such as address decoder, encoder, drivers, sense amplifiers and the like. A CAM array 106 may include X lines of memory cells, referred as X CAM entry lines, that can be addressable. For example, a CAM array 106 that can be addressed by an 8-bit address may include 256 CAM entry lines, such that each 8-bit combination can correspond a CAM entry line of the 256 CAM entry lines. Additionally, addresses of the X CAM entry lines may be used to suggest a priority sequence. For example, a low address may have a high priority.

The priority sequence may enable the CAM array 106 to resolve multiple matching entry lines during operation. For example, the CAM array 106 may store a plurality of switching rules in the CAM entry lines. Further, the CAM entry lines of the CAM array 106 can be compared to a search key at the same time to determine if the CAM entry lines match the search key. Possibly, more than one CAM entry lines can match the search key. The priority sequence can prioritize a matching CAM entry line from the more than one CAM entry lines, for example, based on the addresses corresponding to the CAM entry lines.

In addition, the priority sequence can be predetermined and can be known to a user of the CAM array 106. Thus, the user can store contents in the CAM entry lines in a desired manner according to the priority sequence, for example preferred rules in low addresses. Thus, the CAM entry lines may provide searching result in the desired manner.

According to the disclosure, a CAM array 106 can include at least one redundant entry line, such as a redundant entry line 105. For example, a CAM array 106 that can be addressed by an 8-bit address may include 257 CAM entry lines. One of the 257 CAM entry lines can be a redundant entry line, and the other 256 CAM entry lines can be regular entry lines. The redundant entry line can be used when a regular entry line is defective. Therefore, the CAM array 106 can be operative even though a CAM entry line is defective. Thus, a product yield can be improved. For example, a manufacturing line may have a defect level that may result in a high percentage of CAM arrays having a single defective entry line. The high percentage of CAM arrays can be counted as good if each of the CAM arrays can include a redundant entry line, otherwise the high percentage of CAM arrays may be counted as yield loss, for example.

Additionally, the CAM array 106 may include a switching mechanism that can use the at least one redundant entry line to resolve at least a defective entry line. According to the disclosure, the switching mechanism can transparently maintain a priority sequence to a user of the CAM array 106, even though the defective entry line is replaced by the redundant entry line. The transparent priority sequence can be independent of a defective status of the CAM array 106. In other words, the priority sequence can be the same to the user no matter whether the CAM array 106 is defective or which entry line is defective. Thus, the user can use the CAM array 106 according to the priority sequence, and does not need to be aware of the defective status of the CAM array 106. Thus, the user can be released from adjusting, for example address, to access the CAM array 106.

Further, the switching mechanism can be integrated on the IC chip 100 with the CAM array 106 according to an embodiment of the disclosure. The switching mechanism can be configured according to the defective status of the CAM array 106. In an example, the switching mechanism can be configured to memorize the defective status of the CAM array 106, and then can operate accordingly. According to an aspect of the disclosure, the switching mechanism can be configured during manufacturing, for example, after a test of the CAM array 106. According to another aspect of the disclosure, the switching mechanism can be configured during an application when a defective entry line is detected.

Figure 2:
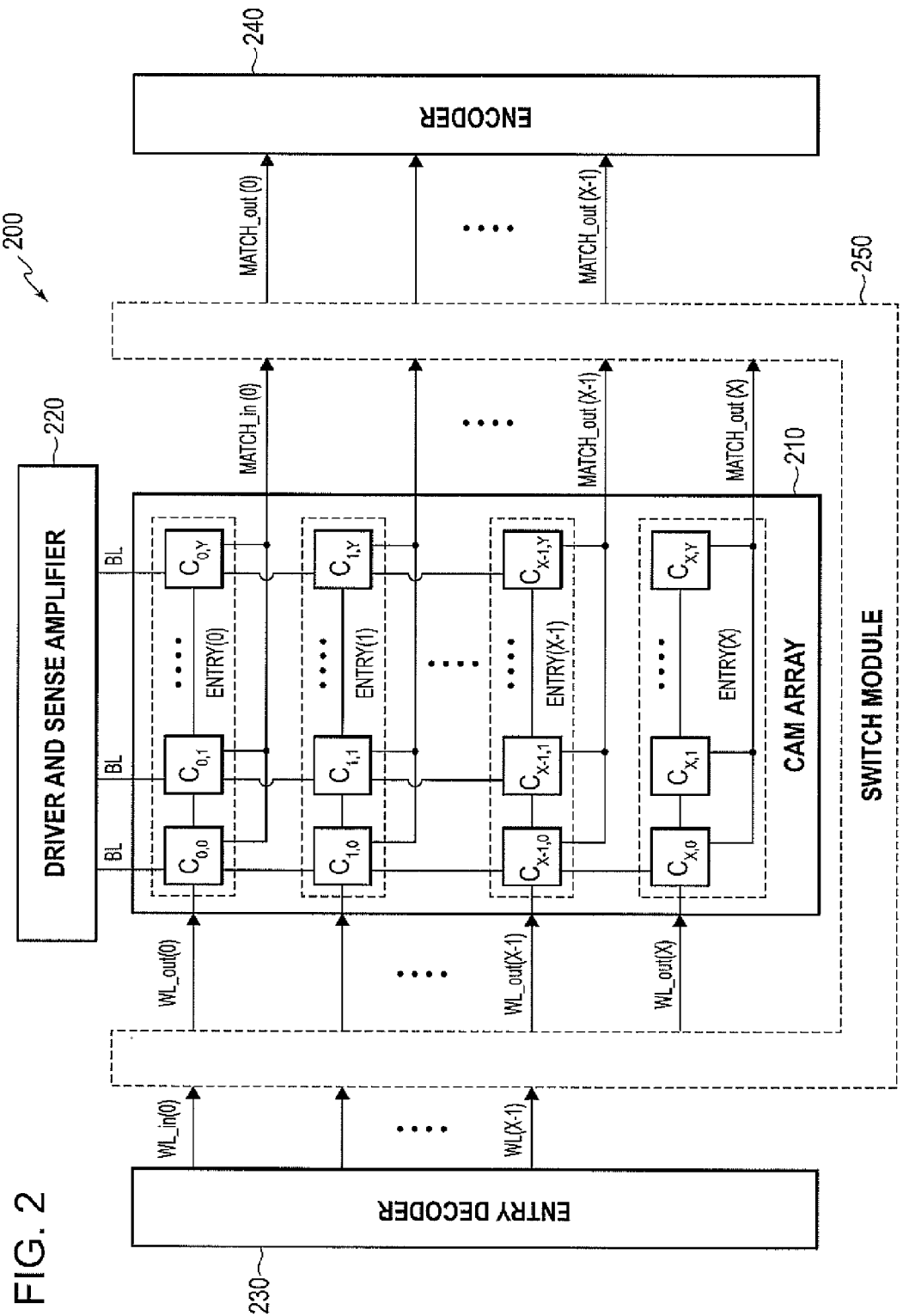
FIG. 2 shows a block diagram of a CAM module example.

FIG. 2 shows a block diagram of a CAM module example according to an embodiment of the disclosure. The CAM module 200 may include a CAM array 210, a switch module 250, an entry decoder 230, an encoder 240, and a driver and sense amplifier module 220. These elements can be coupled together as shown in FIG. 2.

The CAM array 210 may include X regular CAM entry lines, such as ENTRY(0) to ENTRY(X−1), and at least one redundant CAM entry line, such as a redundant entry line ENTRY(X). Each entry line can include a plurality of memory cells that can be arranged in row direction as shown in FIG. 2, or in column direction. For example, ENTRY(0) may include cell $C_{0,0}$ to $C_{0,Y}$, and ENTRY(1) may include cell $C_{1,0}$ to $C_{1,Y}$. Additionally, each entry line may include a selection line, such as WL_out(0) to WL_out(X), and an entry output, such as MATCH_in(0) to MATCH_in(X). A selection line of a given entry line may enable the given entry line for writing or reading in a read or write mode. In an example, the selection line may control pass transistors between bit-lines and memory cells of the given entry line. An entry output of a given entry line may indicate a matching result of the given entry line to a search key in a search mode. For example, when the entry output has a high voltage, the given entry line matches the search key, and when the entry output has a low voltage, the given entry line does not match the search key.

The entry decoder 230 may convert an address into a word line configuration for a plurality of word lines. In the example of FIG. 2, the entry decoder 230 may convert an address into a configuration of X word lines WL_in(0) to WL(X−1). One of the X word lines can be a "hot" line, which is different from the rest of the word lines. For example, the entry decoder 230 may convert an 8-bit address to a configuration of 256 word lines. The configuration can drive one word line corresponding to the 8-bit address with a high voltage, and drive the rest of the word lines with low voltage, for example.

The encoder module 240 can output an address corresponding to a matching configuration of matching lines. In the example of FIG. 2, the encoder module 240 may receive X matching lines, such as MATCH_out( ) to MATCH_out(X−1). A matching line can be indicative of matching or no-matching of a CAM entry line to a search key. For example, high voltage can be matching and low voltage can be no-matching. The encoder module 240 can output an address corresponding to a matching line, such as a matching line being indicative of matching. For example, the encoder module 240 may output an 8-bit address corresponding to a high voltage matching line within 256 matching lines. However, more than one matching lines may be indicative of matching, such as being high voltage, at a time. The encoder module 240 may output an address according to a priority sequence. The address may correspond to a matching line that is ahead of other matching lines indicative of matching according to the priority sequence. For example, the encoder module 240 may output an address corresponding to MATCH_out(0) when both MATCH_out(0) and MATCH_out(1) are high voltage if the MATCH_out(0) is ahead of MATCH_out(1) in the priority sequence.

The driver and sense amplifier 220 may include a driver portion (not shown) and a sense amplifier portion (not shown). The driver portion may drive the bit lines (BL) in a write mode, and drive a search key in a search mode. The sense amplifier portion may be configured to obtain data stored in a selected CAM entry line in a read mode.

The switch module 250 can provide a defect independent interface between the CAM array 210 and its peripheral circuits, such that a user who uses the peripheral circuits to access the CAM array 210 in an application mode does not need to be aware of the defective status of entry lines in the CAM array 210. As shown in FIG. 2, the switch module 250 may couple the CAM array 210 with the entry decoder 230 and the encoder 240.

The switch module 250 can receive word lines from the entry decoder 230, and provide selection lines to the CAM array 210 based on the defective status of the CAM array 210. In the FIG. 2 example, the switch module 250 can receive the X word lines WL_in(0) to WL_in(X−1) from the entry decoder 230, and provide X+1 selection lines WL_out(0) to WL_out(X) to the CAM array 210, which may include X regular entry lines and a redundant entry line. Match to a redundant entry line may or may not be provided for ever search. For example, in an embodiment, a redundant entry line may be included in the search only if one of the other entry line is defective.

Further, the switch module 250 may receive entry outputs from the CAM array 210, and provide matching lines to the encoder module 240 based on the defective status of the CAM array 210. In the FIG. 2 example, the switch module 250 can receive X+1 entry outputs MATCH_in(0) to MATCH_in(X) from the CAM array 210, and provide X matching lines MATCH_out(0) to MATCH_out(X−1) to the encoder module 240.

Additionally, the switch module 250 can provide a predetermined priority sequence that is independent of a defective status of the CAM array 210 to the user. The predetermined priority sequence may enable the user in an application mode to determine a storing configuration without the need to know the defective status of the CAM array 210, e.g. which entry line is defective. For example, the predetermined priority sequence may relate to the addresses of the word lines and the matching lines, and may not relate to selection lines and entry outputs of the CAM entry lines.

According to an embodiment of the disclosure, the switch module 250 may be configured in a configuration mode according to a defective status of the CAM array 210 to switch the word lines and the matching lines to non-defective entry lines of the CAM array 210. Thus, the user of the CAM module 200 can use the CAM module 200 without the need to know the defective status of the CAM array 210. According to another embodiment of the disclosure, the switch module 250 may memorize a defective status of the CAM array 210, and can be configured according to the memorized defective status. Thus, the user of the CAM module 200 can use the CAM module 200 without the need to know of the defective status.

The switch module 250 may operate in a configuration mode and various application modes. The various application modes may include a write mode, a read mode, and a search mode.

In the configuration mode, the switch module 250 can be configured according to a defective status of the CAM array 210, e.g. which entry line is defective. In an embodiment, the switch module 250 may include a defect indicator that can indicate which entry line is defective. In an example, the switch module 250 may be configured during manufacturing, such as via a fuse mechanism, a non-volatile memory mechanism, and the like, to memorize the defective status of the CAM array 210, e.g. which entry line is defective. In another example, the switch module 250 can be configured in a configuration mode prior to an application, for example, by a non-volatile memory mechanism or a volatile memory mechanism, to memorize the defective status of the CAM array 210.

In the write mode, a user, such as a person, a user program, and the like, may provide an address and data for storing to the CAM module 200. The address can be decoded by the entry decoder 230 to a word line configuration of X word lines. The configuration may include a "hot" word line corresponding to the address. The data may be driven by the driver and sense amplifier module 220. The switch module 250 may couple the X word lines to X selection lines of non-defective entry lines respectively according to its configuration, which is based on the defective status of the CAM array 210. More specifically, the switch module 250 can couple the "hot" word line to a selection line of a non-defective entry line. Thus, the non-defective entry line can be selected to store the data.

In the read mode, a user, such as a person, a user program, and the like, may provide an address for reading to the CAM module 200. The address can be decoded by the entry decoder 230 to a word line configuration of the X word lines. The configuration may include a "hot" word line corresponding to the address. The switch module 250 may couple the X word lines to X selection lines of non-defective entry lines respectively according to its configuration, which is based on the defective status of the CAM array 210 that may indicate a specific entry line that is defective. More specifically, the switch module 250 can couple the "hot" word line to a selection line of a non-defective entry line. Thus, the non-defective entry line can be selected for access, and the driver and sense amplifier 220 can access the non-defective entry line to obtain the stored data.

In the search mode, the driver and sense amplifier 220 can drive a search key. The search key can be compared to each CAM entry line of the CAM array 210. Each CAM entry line can output an entry output that is indicative of the comparison result. The entry outputs can be received by the switch module 250. According to the switch module 250 configuration, which is based on the defective status of the CAM array 210, the switch module 250 may couple X entry outputs of the non-defective entry lines to the X matching lines respectively. Then, the X matching lines can be received by the encoder module 240. The encoder module 240 can output a matching address according to the X matching lines configuration along with the predetermined priority sequence.

Figure 3:
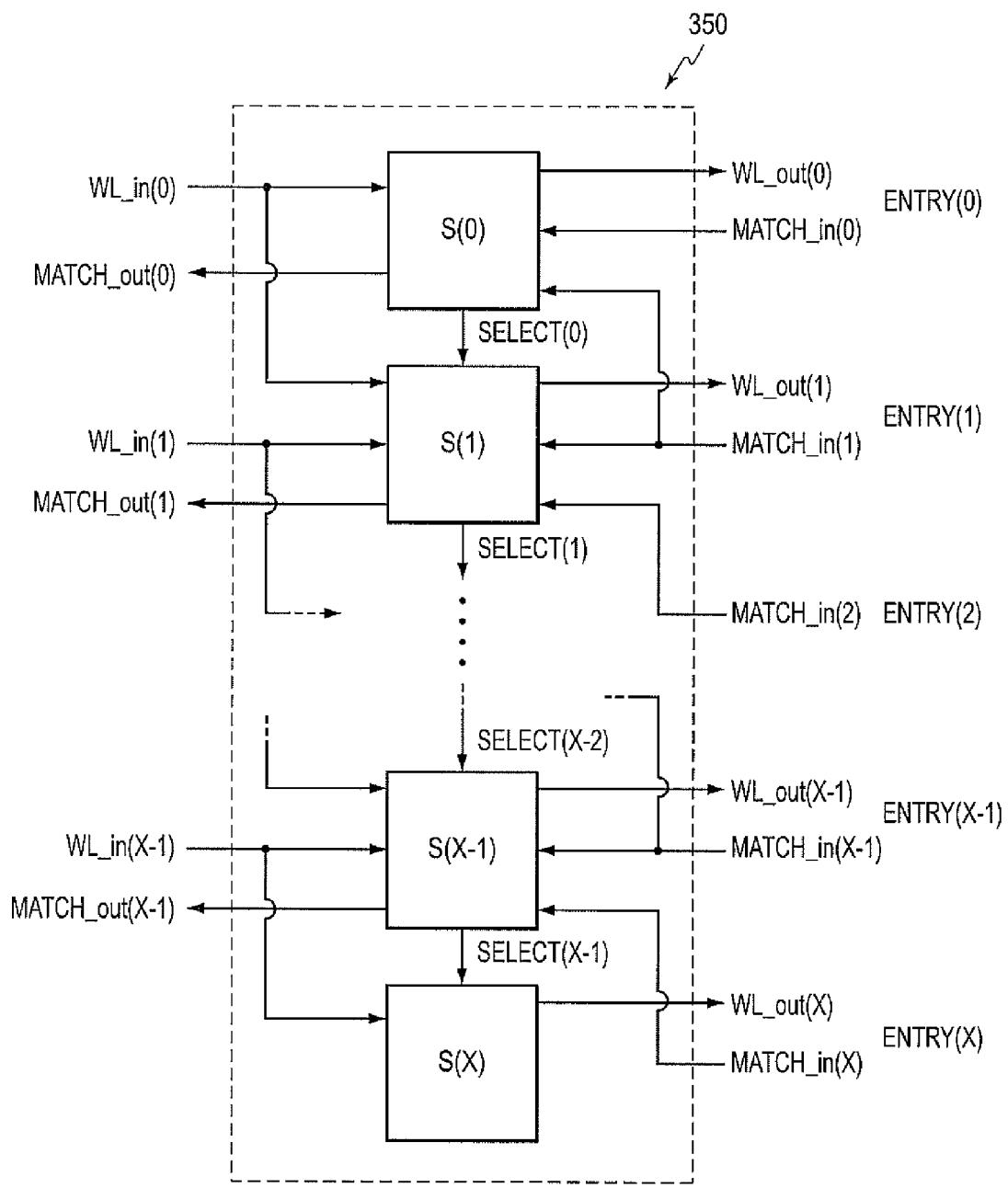
FIG. 3 shows a block diagram of a switch module example.

FIG. 3 shows a simplified block diagram of a switch module example that can maintain order of the CAM entry lines. The order maintaining switch module 350 can be used in a CAM module, such as the CAM module 200 in FIG. 2, coupling a CAM array with peripheral circuits, such as an entry decoder module and an encoder module. The order maintaining switch module 350 may include a plurality of switches, such as S(0)-S(X), corresponding to a plurality of CAM entry lines of a CAM array, including regular entry lines and at least one redundant entry line.

The order maintaining switch module 350 can be configured according to a defective status of the CAM array, e.g. a defect indicator that indicates which entry line is defective, such that the order maintaining switch module 350 can couple word lines from an entry decoder module to selection lines of non-defective CAM entry lines, and coupled entry outputs of the non-defective CAM entry lines to matching lines of an encoder module. For example, the order maintaining switch module 350 can be configured to select X non-defective entry lines. Thus, the order maintaining switch module 350 may couple the X word lines to the selection lines of the selected X non-defective entry lines, and couple the entry outputs of the selected X non-defective entry lines to the matching lines.

In the example of FIG. 3, the order maintaining switch module 350 can be used for a CAM array that includes a redundant entry line. A switch of the order maintaining switch module 350 may be associated with a CAM entry line of the CAM array. The switch can be configured according to the defective status of the CAM array. The switch can provide a selection line for the CAM entry line by multiplexing a plurality of word lines according to its configuration, and can multiplex an entry output of the CAM entry line with at least one other entry output to a matching line according to its configuration.

In the example of FIG. 3, a switch can receive two word lines and multiplex the two word lines to drive a selection line of an associated CAM entry line. For example, the switch S(1) can be associated with an ENTRY(1), which may include a selection line WL_out(1) and an entry output MATCH_in(1). The switch S(1) can receive two word lines WL_in(0) and WL_in(1), and multiplex the two word lines to drive the selection line WL_out(1) according to its configuration. Additionally, the switch S(1) can receive the entry output MATCH_in(1) and another entry output MATCH_in (2), which can be an entry output of ENTRY(2), and multiplex the two entry outputs to a matching line MATCH_out(1) according to its configuration. More specifically, in one configuration, such as a configuration corresponding to both ENTRY(0) and ENTRY(1) being non-defective entry lines, the switch S(1) may couple WL_in(1) to WL_out(1), and couple MATCH_in(1) to MATCH_out(1). In another configuration, such as a configuration corresponding to ENTRY (0) is defective, the switch S(1) may couple WL_in(0) to WL_out(1), and couple MATCH_in(2) to MATCH_out(1).

In FIG. 3, the order maintaining switch module 350 may be used for a CAM array that includes one redundant entry line at the end of the CAM array. It is noted that the switch module 350 can be suitably adjusted for a CAM array with a redundant entry line ordered at any position of the CAM array. It is also noted that the order maintaining switch module 350 can be suitably adjusted for a CAM array that may include more than one redundant CAM entry lines.

Figure 4:
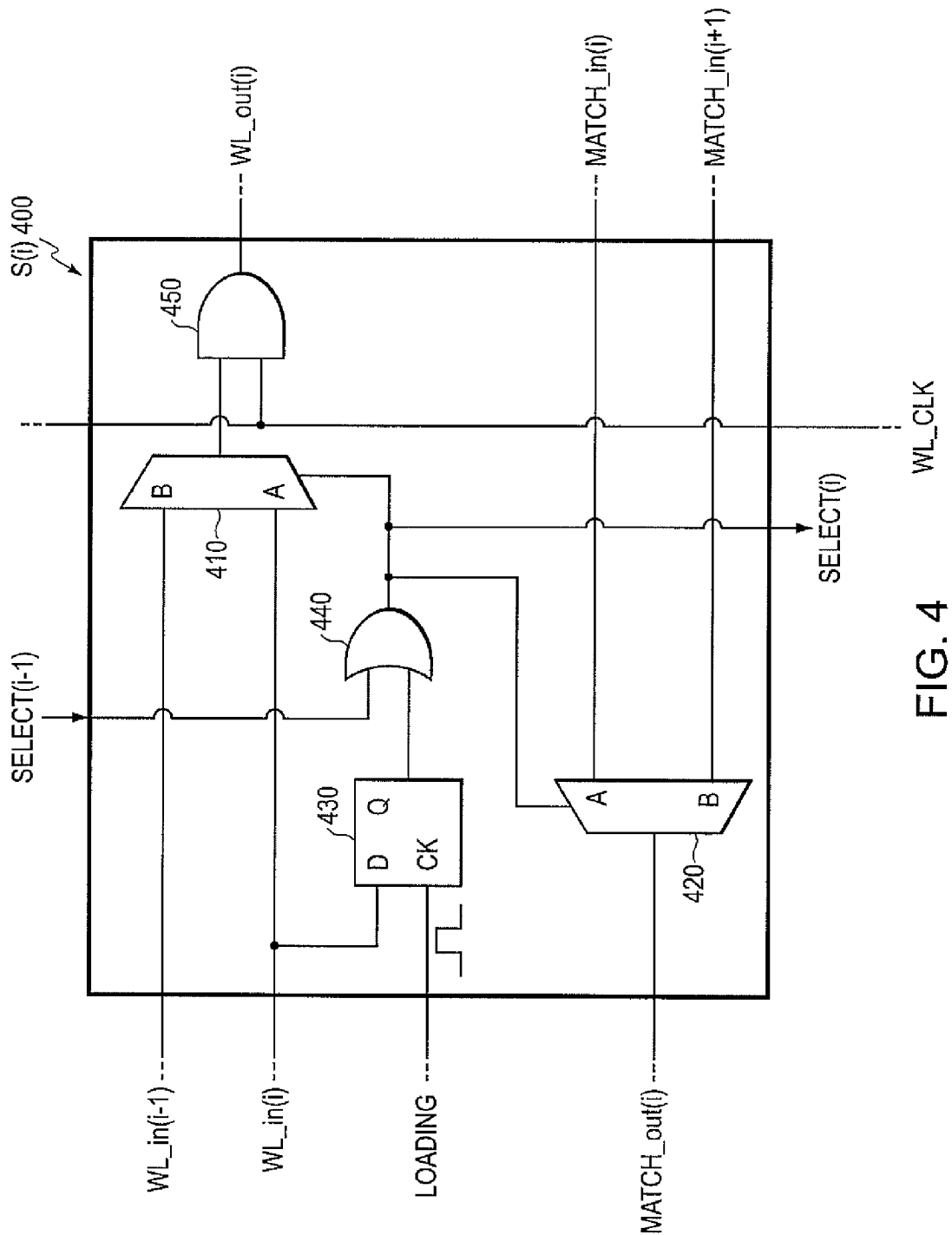
FIG. 4 shows a block diagram of a switch example.

FIG. 4 shows a block diagram of a switch example. The switch S(i) 400 can be used in the order maintaining switch module 350, for example in association with an ENTRY(i) of an ordered CAM array. The switch S(i) 400 may include a first multiplexer 410 and a second multiplexer 420 that can operate according to a defective status of the CAM array.

The first multiplexer 410 may receive two word lines WL_in(i) and WL_in(i−1), and multiplex the two word lines to a selection line WL_out(i) of the ENTRY(i). The first multiplexer 410 can be controlled by a select input SELECT (i). The SELECT(i) can be configured according to the defective status of the CAM array, e.g. a defect indicator that indicates which entry line is defective. For example, when an entry line ordered ahead of the ENTRY(i) or the ENTRY(i) is defective, the SELECT(i) can be configured to couple the WL_in(i−1) to the selection line WL_out(i), otherwise the SELECT(i) can be configured to couple the WL_in(i) to the selection line WL_out(i).

The second multiplexer 420 may receive an entry output MATCH_in(i) of the ENTRY(i) and another entry output, such as an entry output MATCH_in(i+1) of an ENTRY(i+1), and multiplex the two entry outputs to a matching line MATCH_out(i). The second multiplexer 420 can also be controlled by the select input SELECT(i). For example, when an entry line ordered ahead of the ENTRY(i) or the ENTRY(i) is defective, the SELECT(i) can couple the MATCH_in(i+1) to the MATCH_out(i), otherwise the SELECT(i) can couple the MATCH_in(i) to the MATCH_out(i).

Additionally, the switch S(i) may include a memory device, such as a D flip-flop 430, to store 1 bit indicator indicating if the corresponding entry line is good or defective, and other suitable circuits, such as an OR gate 440, an AND gate 450 and the like, that can provide necessary logic operations. In the example of FIG. 4, a plurality of switches, such as a plurality of S(i), can be serially connected to store the defective status of the CAM array, and can configure a plurality of SELECT signals, such as the SELECT(i), accordingly. More specifically, the OR gate 440 may determine the SELECT(i) signal based on the stored indicator of S(i) and the previous SELECT(i−1) signal. In other words, the SELECT (i) may stay "0" if the stored indicator of S(i) is "0" and the previous SELECT(i−1) is "0", and may be set to "1" if the stored indicator of S(i) is "1", which may indicate the corresponding entry line is defective, or the previous SELECT(i−1) is "1", which may indicate a previous entry line is defective. Therefore, if the entry line corresponding to the S(i) is defective, the SELECT(i) and above, such as SELECT(i+1), SELECT(i+2) and so on, can be configured in state "1", for example. When the SELECT(i) is "1", the first and second multiplexers 410 and 420 can be controlled to select the next entry line in the ordered CAM array. Thus, the defective entry line can be bypassed. Similarly, multiplexers in the switches after the S(i), such as S(i+1), S(i+2), and the like, may also be controlled to select corresponding next entry lines, according to SELECT(i+1), SELECT(i+2), and the like.

Additionally, the switches, such as S(i), may operate according to a clock signal. For example, the AND gate 450 may output the selection line WL_out(i) according to a WL_CLK signal. More specifically, when the WL_CLK is "0", the selection line WL_out(i) is "0", and when the WL_CLK is "1", the selection line WL_out(i) can receive a signal from the first multiplexer 410.

The switch S(i) may operate in a configuration mode and an operation mode. In the configuration mode, the switch S(i) may be configured according to the defective status of the CAM array. In the operation mode, the switch S(i) may operate according to its configuration.

In the example of FIG. 4, the D flip-flop may receive its input from a word line. Thus, the switch S(i) may be configured using the same peripheral circuits, such as entry decoder, and the like, of a CAM module in the configuration mode. For example, when an entry line in the CAM array 210 is detected to be defective, the address of the defective entry line can be provided to the entry decoder 230 in the configuration mode. The entry decoder 230 can convert the defective entry line address into a word line configuration of X word lines. The word line configuration can be indicative of the defective status, such as a "hot" word line for the defective entry line. The X word lines can be received by the plurality of switches, such as S(i) 400. Additionally, a loading pulse can be provided to the switch S(i) 400. The loading pulse may cause the D flip-flop to memorize the word line state, thus memorize the defective status of the CAM array 210. Further, the memorized defective status can configure the SELECT signals accordingly.

Figure 5:
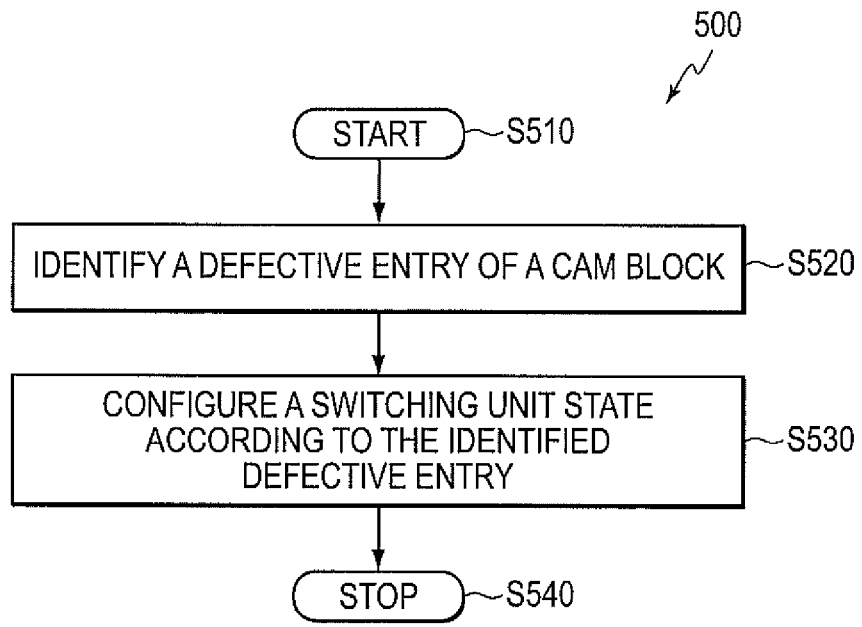
FIG. 5 shows a flow chart outlining a defective status configuration process example.

FIG. 5 shows a flow chart outlining a process example for configuring a CAM device according to a defective status of a CAM array in the CAM device. The process starts at step S510, and proceeds to step S520.

In step S520, a defective entry line of the CAM device may be identified. In an example, a defective entry line may be identified during a manufacturing process, such as a testing process, by a tester machine. In another example, a defective entry line may be identified in application, such as during a system calibration that calibrates the CAM device. Then, the process proceeds to step S530.

In step S530, a switching mechanism, such as the switch module 250, the order maintaining switch module 350, can be configured according to the defective status of the array, such as which entry line is defective. The switching mechanism can be configured to select non-defective entry lines in the CAM array, and couple the non-defective entry lines with peripheral circuits of the CAM device.

In an example, the switching mechanism can be configured permanently. For example, the switching mechanism may include fuses, the fuses can be permanently configured by applying a large current. In another example, the switching mechanism can include a memory device that can memorize the defective status. Then, the switching mechanism can be configured according to the memorized defective status. It is noted that the memory device can be a non-volatile memory that can memorize the defective status even without power supply, or a memory that may need power supply to memorize the defective status. Then, the process proceeds to step S540 and terminate.

Figure 6:
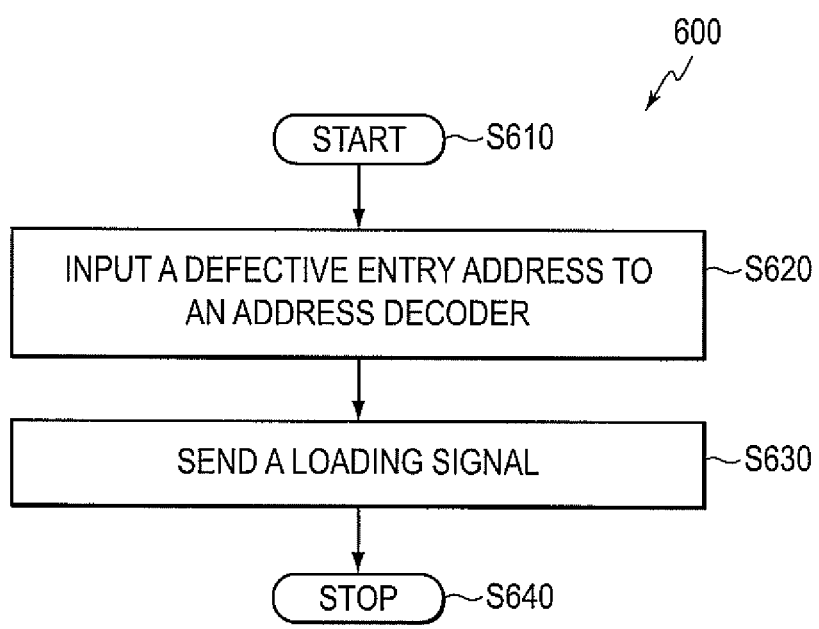
FIG. 6 shows a flowchart outlining a detailed configuration process example.

FIG. 6 shows a flowchart outlining a configuration process example in accordance to the switch example 400. The configuration process 600 may reuse peripheral circuits of a CAM module to configure a switching mechanism that can include a plurality of switches 400. The process 600 starts at step S610, and proceeds to step S620.

In step S620, the process may input a defective entry line address to an entry decoder of the CAM module. The entry decoder may convert the defective entry line address into a word line configuration. The word line configuration can include a "hot" line corresponding to the defective entry line. The "hot" line can be received by a switch 400 that is associated with the defective entry line. Then, the process proceeds to step S630.

In step S630, a loading signal can be provided to the plurality of switches 400 to load the corresponding word line state in a memory device, such as D flip-flop. For example, a switch corresponding to the defective entry line may be loaded with "1", while switches correspond to the non-defective entry line may be loaded with "0". Thus, the switching mechanism can be configured according to the memorized defective status. For example, the SELECT signals in the plurality of switches 400 can be determined according to the logic circuits. More specifically, a portion of the SELECT signals corresponding to entry lines ordered before the defective entry line may stay "0", while a portion of the SELECT signals corresponding to the defective entry line and entry lines ordered after the defective entry line may be set to "1". Thus, the defective entry line can be bypassed. Then, the process proceeds to step 640, and terminates.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A content addressable memory (CAM) device, comprising:
    a plurality of ordered CAM entry lines and at least one additional CAM entry line;
    a comparison circuit configured to compare a key against the plurality of ordered CAM entry lines and to output a match indication for the ordered CAM entry lines that match the key;
    a priority encoding circuit configured to prioritize the match indication and output at least one match indication according to a priority; and
    an entry line replacement circuit configured to bypass a defective CAM entry line and to activate the at least one additional CAM entry line while maintaining the order of the ordered CAM entry lines.

2. The CAM device according to claim 1, wherein the plurality of ordered CAM entry lines are physically ordered.

3. The CAM device according to claim 2, wherein the defective CAM entry line is bypassed and the at least one additional entry line is activated while maintaining the physical order of the physically ordered CAM entry lines.

4. The CAM device according to claim 1, wherein each of the ordered CAM entry lines comprises:
a selection line configured to enable a CAM entry line for writing and/or reading; and
an entry output for indicating a match to the key.

5. The CAM device according to claim 1, further comprising:
a defect indicator for indicating a defect in at least one of the ordered CAM entry lines.

6. The CAM device according to claim 1, wherein the CAM device is a ternary content addressable memory (TCAM).

7. An integrated (IC) chip, comprising a content addressable memory (CAM) device, wherein the CAM device further comprises:
a plurality of ordered CAM entry lines and at least one additional CAM entry line;
a comparison circuit configured to compare a key against the plurality of ordered CAM entry lines and to output a match indication for the ordered CAM entry lines that match the key;
a priority encoding circuit configured to prioritize the match indication and output at least one match indication according to a priority; and
an entry line replacement circuit configured to bypass a defective CAM entry line and to activate the at least one additional CAM entry line while maintaining the order of the ordered CAM entry lines.

8. The IC chip according to claim 7, wherein the plurality of ordered CAM entry lines are physically ordered.

9. The IC chip according to claim 8, wherein the defective CAM entry line is bypassed and the at least one additional entry line is activated while maintaining the physical order of the physically ordered CAM entry lines.

10. The IC chip according to claim 7, wherein each of the ordered CAM entry lines comprises:
a selection line configured to enable a CAM entry line for writing and/or reading; and
an entry output for indicating a match to the key.

11. The IC chip according to claim 7, wherein the CAM device further comprises:
a defect indicator for indicating a defect in at least one of the ordered CAM entry lines.

12. The IC chip according to claim 7, wherein the CAM device is a ternary content addressable memory (TCAM).

13. A network switch, comprising a content addressable memory (CAM) device, wherein the CAM device further comprises:
a plurality of ordered CAM entry lines and at least one additional CAM entry line, wherein the CAM entry lines are configured to store switching rules employed by the network switch;
a comparison circuit configured to compare a key against the plurality of ordered CAM entry lines and to output a match indication for the ordered CAM entry lines that match the key;
a priority encoding circuit configured to prioritize the match indication and output at least one match indication according to a priority; and
an entry line replacement circuit configured to bypass a defective CAM entry line and to activate the at least one additional CAM entry line while maintaining the order of the ordered CAM entry lines.

14. The network switch according to claim 13, wherein the plurality of ordered CAM entry lines are physically ordered.

15. The network switch according to claim 14, wherein the defective CAM entry line is bypassed and the at least one additional entry line is activated while maintaining the physical order of the physically ordered CAM entry lines.

16. The network switch according to claim 13, wherein each of the ordered CAM entry lines comprises:
a selection line configured to enable a CAM entry line for writing and/or reading; and
an entry output for indicating a match to the key.

17. The network switch according to claim 13, wherein the CAM device further comprises:
a defect indicator for indicating a defect in at least one of the ordered CAM entry lines.

18. The network switch according to claim 13, wherein the CAM device is a ternary content addressable memory (TCAM).

19. A method for using a content addressable memory (CAM) device, comprising:
comparing a key against a plurality of ordered CAM entry lines;
generating a match indication for the ordered CAM entry lines that match the key;
prioritizing the match indication and generating at least one match indication according to a priority by a priority encoding circuit; and
bypassing a defective CAM entry line and activating at least one additional CAM entry line by an entry line replacement circuit while maintaining the order of the ordered CAM entry lines.

20. The method according to claim 19, wherein the plurality of ordered CAM entry lines are physically ordered.

21. The method according to claim 20, further comprising:
bypassing the defective CAM entry line and activating the at least one additional CAM entry line while maintaining the physical order of the physically ordered CAM entry lines.

22. The method according to claim 19, further comprising:
enabling each of the ordered CAM entry lines for writing and/or reading; and
indicating a match to the key.

23. The method according to claim 19, further comprising:
indicating a defect in at least one of the ordered CAM entry lines.

24. The method according to claim 19, wherein the CAM device is a ternary content addressable memory (TCAM).

* * * * *